(12) United States Patent
Chang et al.

(10) Patent No.: US 8,133,532 B2
(45) Date of Patent: Mar. 13, 2012

(54) METHOD OF DENSIFYING POROUS ARTICLES

(75) Inventors: Kenny Chang, Union, KY (US);
Patrick Loisy, Batavia, OH (US); Yvan Baudry, Bordeaux (FR)

(73) Assignee: Messier-Bugatti-Dowty, Velizy-Villacoublay (FR)

( * ) Notice: Subject to any disclaimer, the term of this patent is extended or adjusted under 35 U.S.C. 154(b) by 728 days.

(21) Appl. No.: 12/281,820

(22) PCT Filed: Oct. 24, 2007

(86) PCT No.: PCT/EP2007/061429
§ 371 (c)(1),
(2), (4) Date: Sep. 5, 2008

(87) PCT Pub. No.: WO2008/052923
PCT Pub. Date: May 8, 2008

(65) Prior Publication Data
US 2009/0053413 A1 Feb. 26, 2009

Related U.S. Application Data

(60) Provisional application No. 60/863,377, filed on Oct. 29, 2006.

(51) Int. Cl.
*C23C 16/00* (2006.01)
*C23C 16/02* (2006.01)

(52) U.S. Cl. .................................. 427/249.4; 427/249.2
(58) Field of Classification Search ............... 427/248.1, 427/249.1–249.2
See application file for complete search history.

(56) References Cited

U.S. PATENT DOCUMENTS

| | | | | |
|---|---|---|---|---|
| 3,991,248 A | * | 11/1976 | Bauer | 442/148 |
| 5,904,957 A | * | 5/1999 | Christin et al. | 427/248.1 |
| 6,057,022 A | | 5/2000 | Purdy et al. | |
| 6,083,560 A | * | 7/2000 | Fisher et al. | 427/249.2 |
| 6,572,371 B1 | * | 6/2003 | Sion et al. | 432/247 |
| 6,953,605 B2 | | 10/2005 | Sion et al. | |
| 7,060,134 B2 | * | 6/2006 | Chang | 118/728 |
| 2004/0175564 A1 | | 9/2004 | Chang | |
| 2005/0176329 A1 | * | 8/2005 | Olry et al. | 442/388 |

OTHER PUBLICATIONS

International Search Report dated Jun. 23, 2008, which issued in PCT/EP2007/061429.

* cited by examiner

*Primary Examiner* — Matthew Daniels
*Assistant Examiner* — Jodi C Franklin
(74) *Attorney, Agent, or Firm* — Pillsbury Winthrop Shaw Pittman, LLP

(57) ABSTRACT

The present invention describes a method of CVI densification in which particular arrangements and mixtures of undensified porous substrates and partially densified porous substrates are arranged in particular ways in order to use the thermal characteristics of the partially densified porous substrates to better distribute heat throughout a CVI furnace and thereby improve densification.

15 Claims, 16 Drawing Sheets

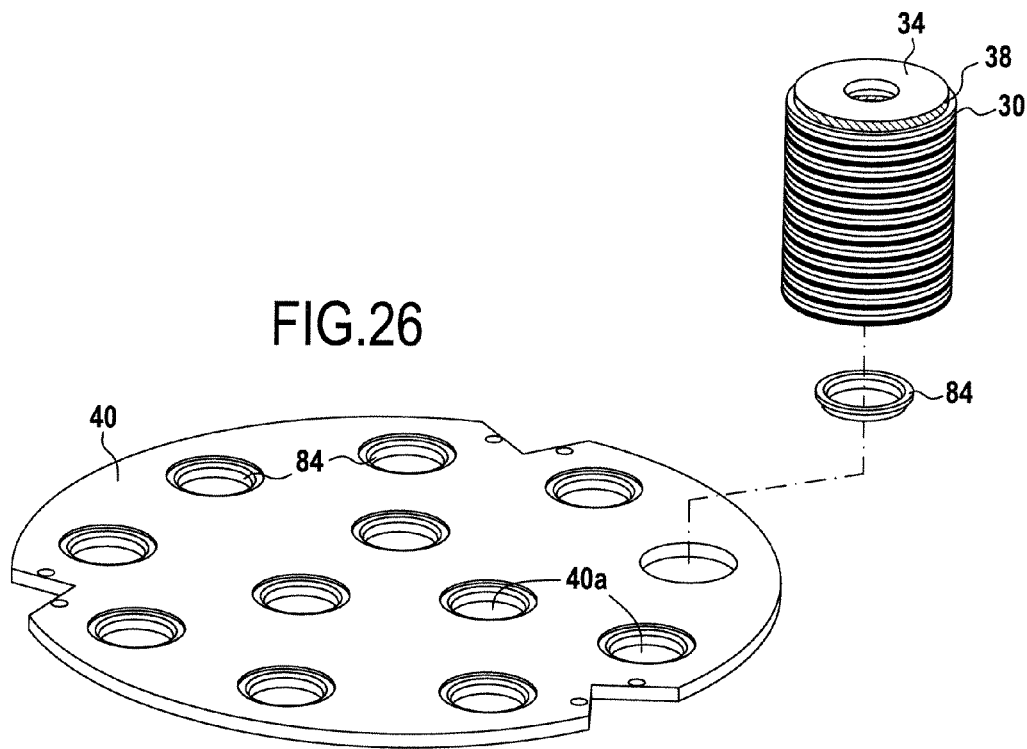
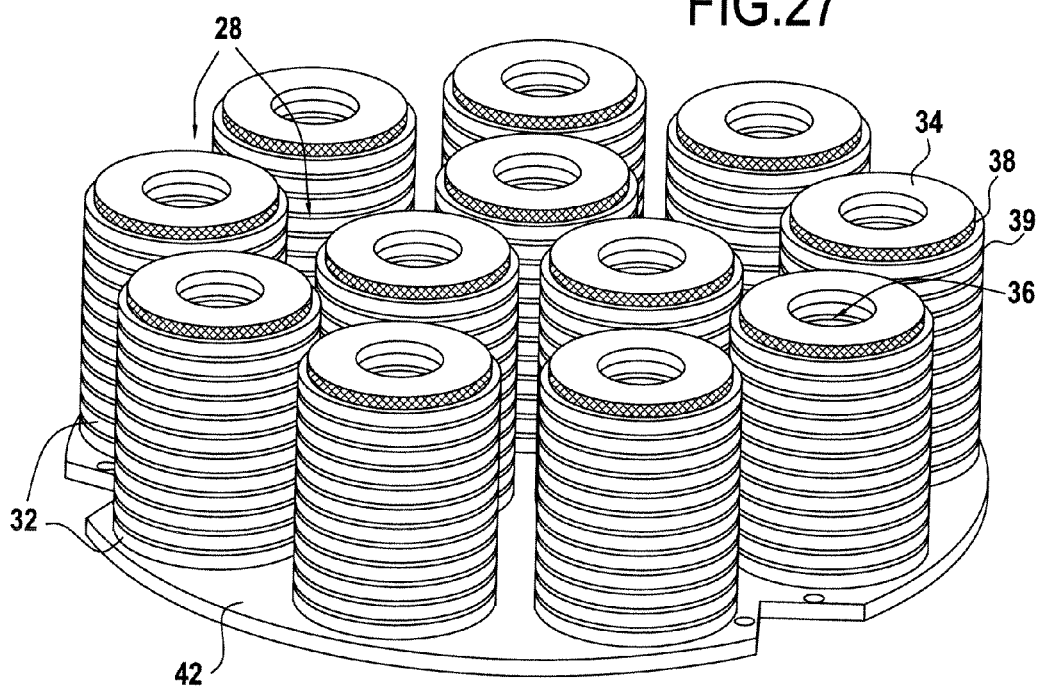

METHOD OF DENSIFYING POROUS ARTICLES

This application is a §371 national phase filing of PCT/EP2007/061429 filed Oct. 24, 2007, and claims priority to U.S. Prov. Appln No. 60/863,377 filed Oct. 29, 2006.

This application claims the benefit of priority from U.S. Provisional Patent Application No. 60/863,377 filed on Oct. 29, 2006.

FIELD OF THE INVENTION

The invention relates to the field of carbon matrix densification made by the chemical vapour infiltration method within a carbonized carbon preform.

BACKGROUND OF THE INVENTION

In a conventional chemical vapour infiltration ("CVI") process for aircraft brake manufacturing, a large number of porous substrates (frequently referred to in the art as "preforms") are placed in a graphite reaction chamber heated by an inductive or resistive heating source to a temperature of about 900° C. to about 1000° C. A precursor gas containing one or more carbon precursors (typically hydrocarbon gases such as methane and/or propane) is admitted into the graphite reaction chamber. The precursor gas or gases are preferably preheated before entering the reaction chamber to a temperature range between about 500° C. and 950° C., and in a particular case, between about 500° C. and 750° C., by a gas preheater in order to minimize a thermal heat loss from the precursor gas. An example of an appropriate gas preheater in this regard is described in U.S. Pat. No. 6,953,605.

In a conventional CVI process, the substrates may require as many as several weeks of continual infiltration processing. One or more intermediate machining steps may also be required to reopen the porosity of the substrates by removing the "seal-coating" that prematurely seals the surface of the substrates and prevents further infiltration of the reactant gas into its inner regions. Important process variables in a CVI process includes substrate temperature and porosity; the flow rate, temperature, and pressure of the precursor gas(es); and reaction time. A particularly important parameter is the substrate temperature. A common problem in CVI densification is that the preforms are not uniformly internally densified. This frequently occurs when the preform substrate temperature has a large gradient.

In addition, the efficiency of conventional gas preheaters may not be as good as desired.

An example of a conventional densifying process relates to densifying undensified substrates, such as annular preforms, and/or partially densified substrates (including annular preforms). The undensified substrates are sometimes referred to in terms of undergoing a first infiltration step or an "I-1" step for short. Likewise, the partially densified substrates undergo a second infiltration step, or an "I-2" step. The annular substrates are arranged in several stacks in the reaction chamber, for example, above a conventional gas preheater.

Examples of conventional loading are illustrated in FIGS. 1 and 2, in which a given tray in the furnace is stacked with either all I-1 or all I-2 substrates. FIGS. 3 and 4 are histograms corresponding to FIGS. 1 and 2, respectively, illustrating the number of substrates on the tray attaining a given density. Several trays, each having several stacks of porous substrates arranged thereon, are in turn stackingly arranged in the furnace. For example, seven trays may be provided.

Full I-1 and Full I-2 Loading Configuration (Conventional Art):

In the arrangement of FIGS. 1 and 2, about 1100 porous substrates, ±100, may be provided in total in the furnace. Densification time may be between about 475 hours and 525 hours. Only I-1 or only I-2 parts are treated at one time. After initial I-1 densification, a separate milling step is required to "reopen" the porosity of the substrates after the I-1 densification step.

A large thermal gradient occurs in the horizontal, or transverse, plane because of poor thermal conductivity and low thermal mass of the fiber preforms. The substrates on the bottom and top trays are relatively poorly densified, while lateral stacks on intermediate trays 2-6 are best densified. Between 30% and 40% of I-1 parts have a bulk density ranges between 1.30 g/cc to 1.40 g/cc. See FIG. 2 for example. Fiber pull-out or delamination around the ID and OD of the pre-densified disk is commonly seen from the intermediate machining operation mainly because I-1 density is too low.

However, temperature gradients may be observed in the reaction chamber in both vertical and horizontal planes, such that the temperature close to substrates in the central stacks (in a radial or horizontal sense) may be at least several tens of degrees C. lower than the temperature of the lateral (i.e., radially exterior) stacks. For example, stacks located in the central part (in a horizontal sense) of the reaction chamber may not benefit from the heat radiated by the susceptor as much as the stacks located closer to the internal side wall of the susceptor. This can cause a large temperature gradient, and consequently, a large densification gradient between the substrates stacked on the same loading plate. FIGS. 5 and 6 illustrate examples of the temperature gradients conventionally present in the horizontal and vertical directions, respectively.

In order to solve this problem using conventional approaches, the size of the gas preheater could be increased to further improve the heating of the substrates. However, if the gas preheater is an internal device (relative to the reaction chamber) this approach reduces the useful load capacity in the furnace, which in turn reduces the number of substrates being treated.

Another problem is the formation of undesirable carbon microstructures, such as smooth laminar carbon, soot, and tar. These type microstructures are not desirable because of their poor thermomechanical and friction properties. These kinds of problems may be attributed to long precursor gas residence times, and to temperature variations in the deposition environment.

Finally, gas preheating can actually create undesirable effects if the temperature of the precursor gases is raised close to the reaction (i.e., deposition) temperature. In particular, the precursor gas or gases may prematurely break down and deposit carbon soot and the like on the surface of the processing equipment or even on the exterior of the preforms. All of these results negatively affect the efficiency of the process and the quality of the resultant articles.

SUMMARY OF THE INVENTION

This invention provides various ways to improve heat distribution throughout the furnace load and thus reduced the densification gradient. The present invention more particularly relates to methods of densifying porous articles or substrates (particularly, annular brake preforms), including the use of certain arrangements of porous articles which are at various stages of the manufacturing process.

A part of the present invention relates to providing partially densified substrates (I-2 parts) in the reaction chamber as a kind of passive heat distribution element, including providing I-2 parts in combination with I-1 parts being densified. The I-2 substrates help reduce temperature gradients among the stacks of I-1 and I-2 substrates being densified as explained herein. The I-2 parts are, for example, partially densified annular brake disc preforms having a bulk density between about 1.250 g/cc and about 1.770 g/cc. During densification, the I-2 parts absorb heat from the furnace and uniformly radiate the absorbed heat to surrounding preforms to thereby desirably reduce the temperature gradient in the furnace. A cycle time reduction of 12% to 30% is achievable mainly due to the temperature improvement from various loading arrangements.

The present invention is additionally applicable in the field of refurbishing worn composite brake disks made from carbon/carbon. Typically, worn brake discs are machined to remove worn surfaces before being redensified, such that the thickness of the machined part is some fraction of the thickness of the original article. In such a case, it is common to "reassemble" two or more partial thickness parts to obtain a correctly dimensioned refurbished part. Of course, redensifying such thinner machined parts is relatively easy and fast compared with thicker articles, and densification could be foreseeably completed in a single step, given correct control of the densification parameters.

BRIEF DESCRIPTION OF THE DRAWINGS

The present invention will be even more clearly understood with reference to the appended figures, in which:

FIGS. 24-29 illustrate various aspects of stacking a plurality of porous substrates.

DETAILED DESCRIPTION OF THE PRESENT INVENTION

In general, the present invention relates to providing a mixture of undensified and partially densified porous substrates, such as brake preforms, in certain arrangements within a CVI furnace in order to take advantage of the physical behaviour of the parts in a manner which enhances densification and throughput. In particular, the present invention contemplates using partially densified porous substrates as a passive heat absorbing element at the central part of the reaction chamber to "hold" heat and enhance the temperature distribution within the furnace and thereby improve the resultant densification. This capacity to hold heat is a function of the mass of the partially densified porous substrates positioned at the central part of the reaction chamber. Depending on the size of the substrates, such as preforms used for brake disks, the mass may be between about 1600 kg and about 2400 kg. For larger preforms, the mass provided at the central part of the reaction chamber may be as much as about 8000 kg.

The present invention will be explained by way of several different arrangements as described and illustrated hereinafter. In general, operational parameters of the CVI furnace are known in the art, to the extent not mentioned specifically here.

EXAMPLE 1

Figure 1:
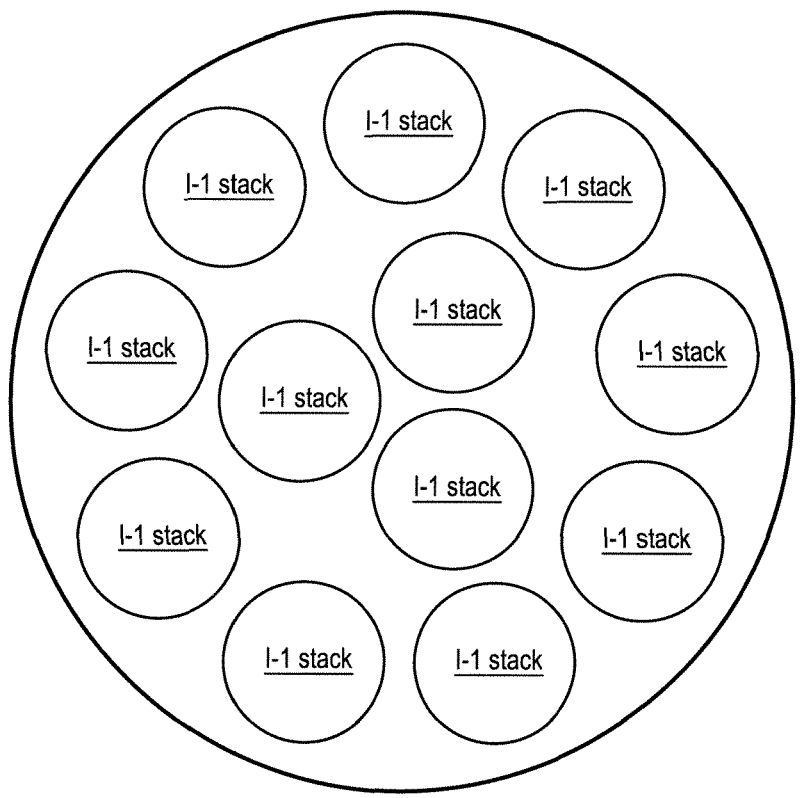
FIG. 1 is a schematic plan view of an arrangement of stacks of porous substrates arranged for CVI densification.
Figure 2:
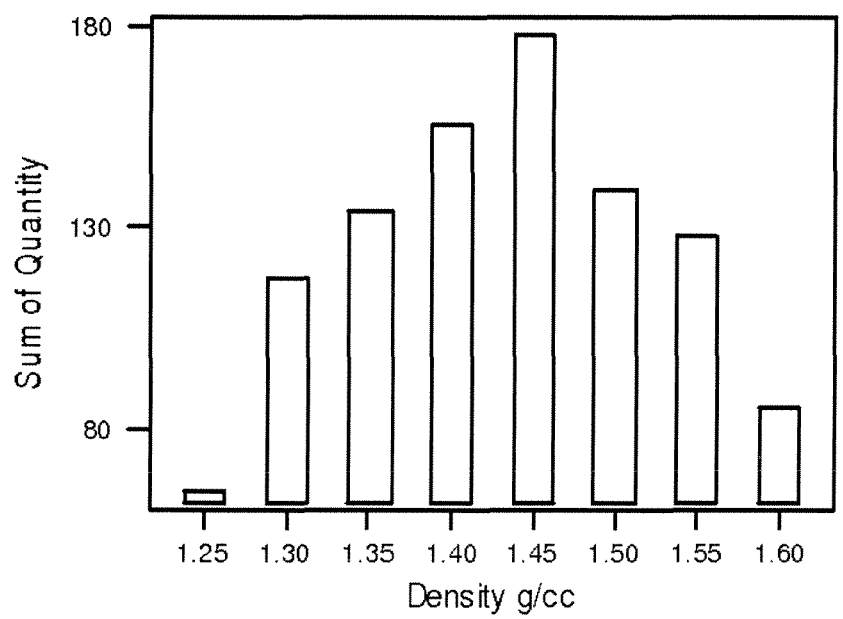
FIG. 2 is histogram illustrating the number of parts attaining a given density in the arrangement of FIG. 1.
Figure 3:
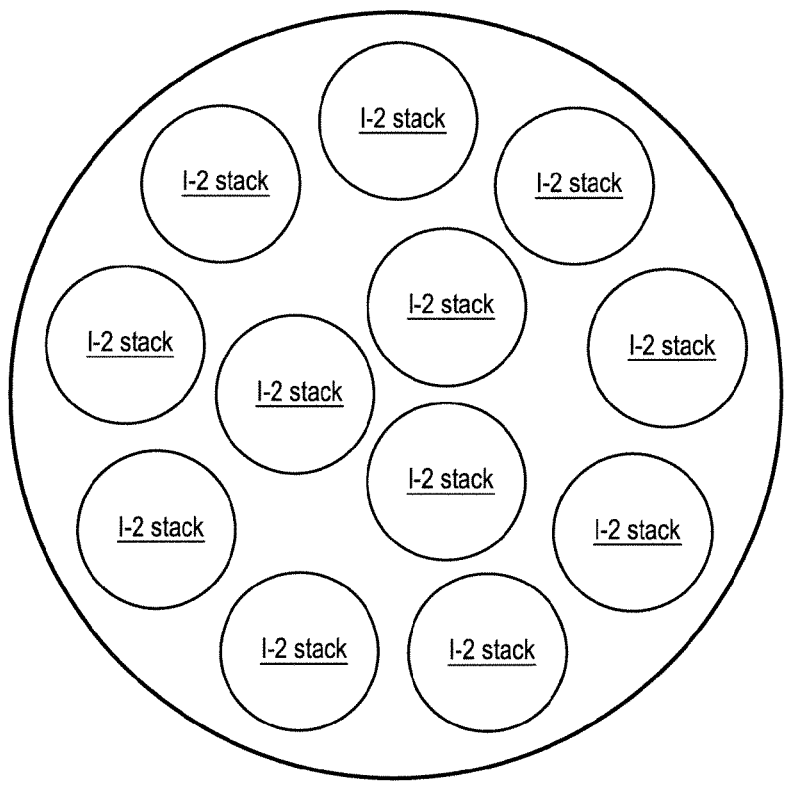
FIG. 3 is a schematic plan view of an arrangement of stacks of porous substrates arranged for CVI densification.
Figure 4:
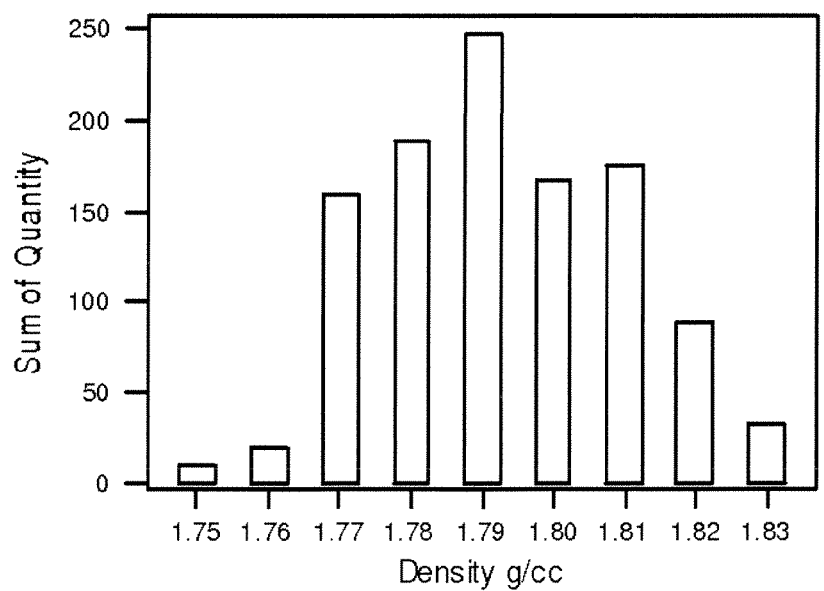
FIG. 4 is a histogram illustrating the number of parts attaining a given density in the arrangement of FIG. 3.
Figure 5:
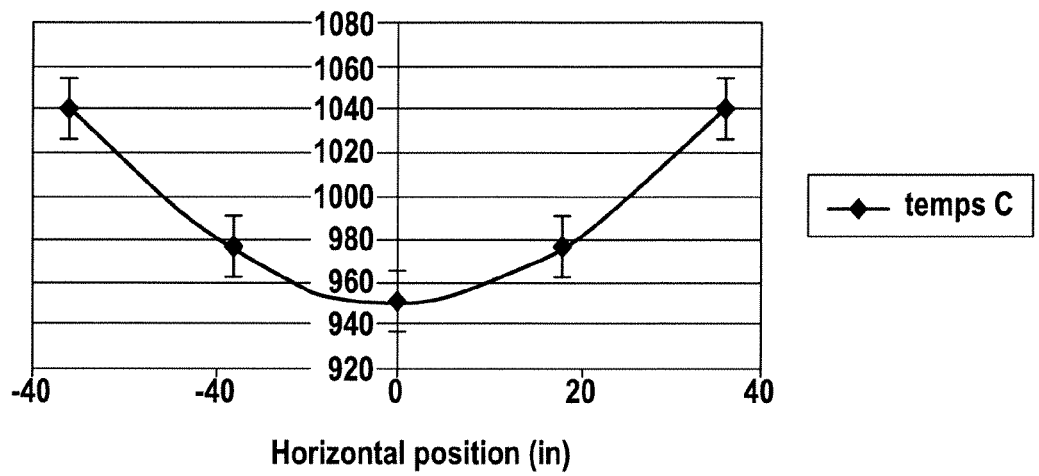
FIGS. 5 and 6 illustrate transverse (horizontal) and vertical temperature gradients in conventional CVI installations, respectively.
Figure 6:
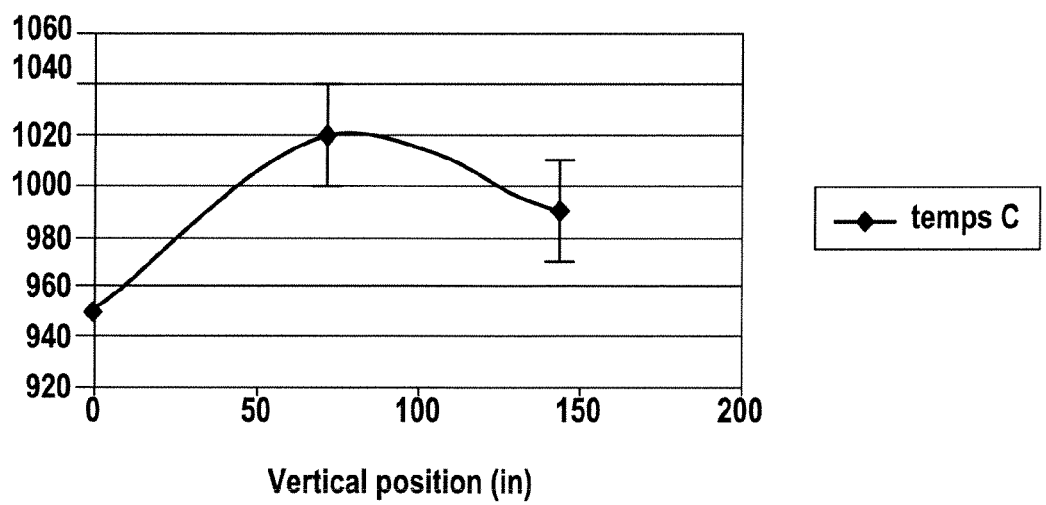
Figure 7:
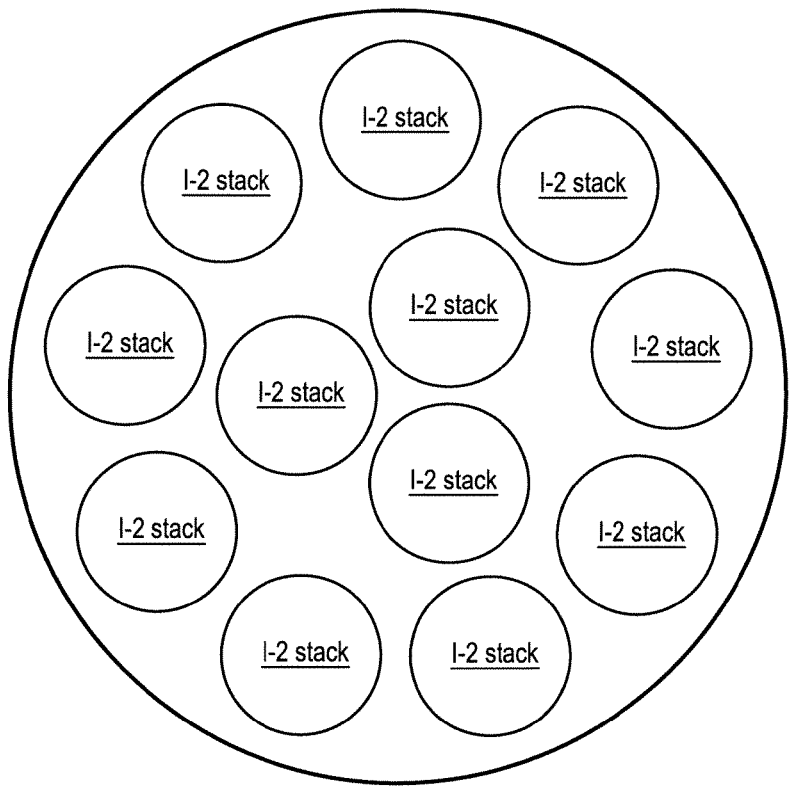
FIGS. 7 and 9 are schematic stack arrangements according to the present invention, wherein an arrangement according to FIG. 7 is provided at the top and the bottom of the furnace, generally, and trays according to Figure are provided in intermediate parts of the furnace.
Figure 8:
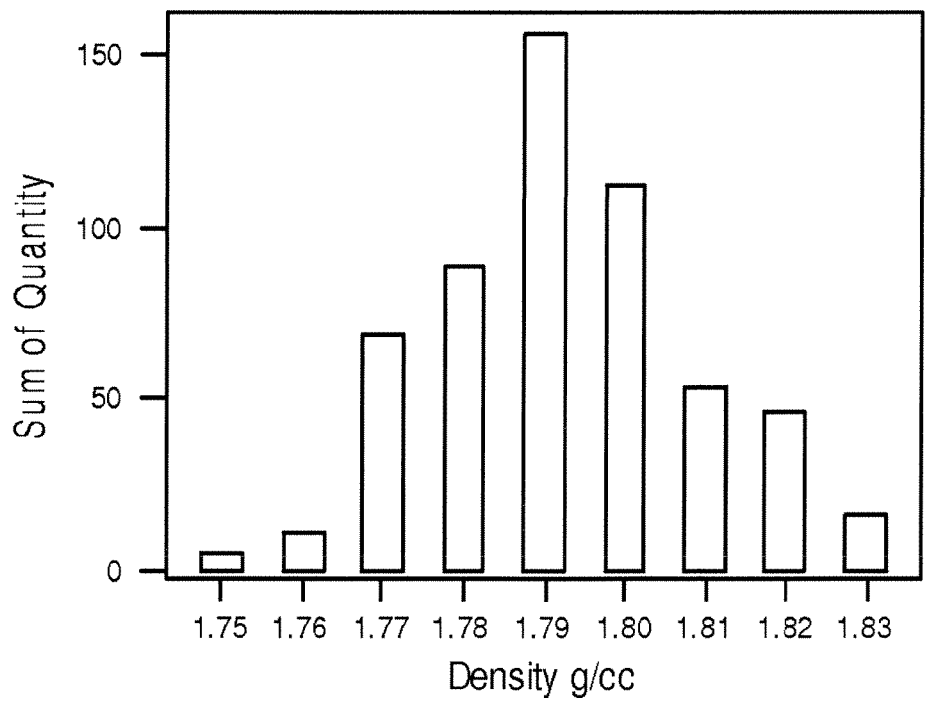
FIGS. 8 and 10 are density histograms corresponding to FIGS. 7 and 9, respectively.
Figure 9:
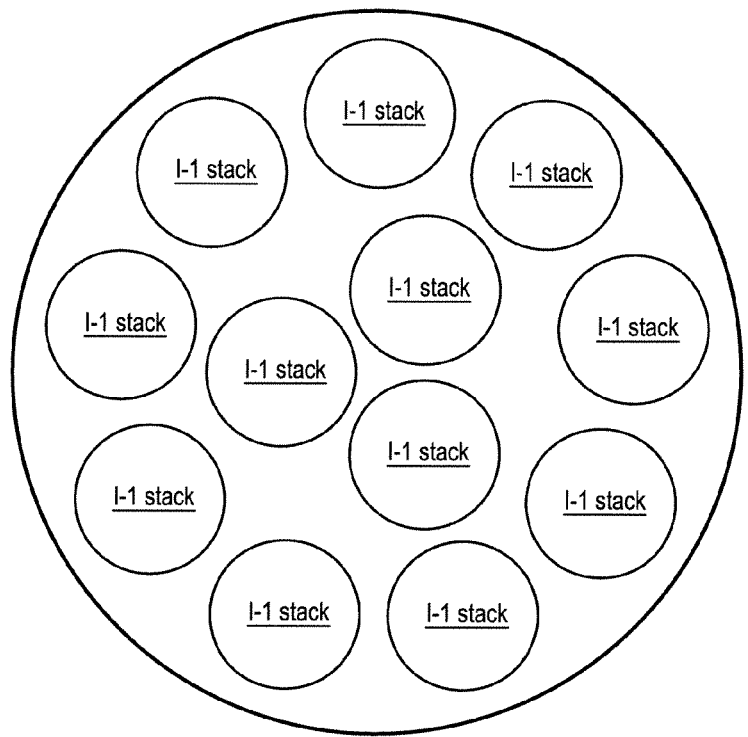
Figure 10:
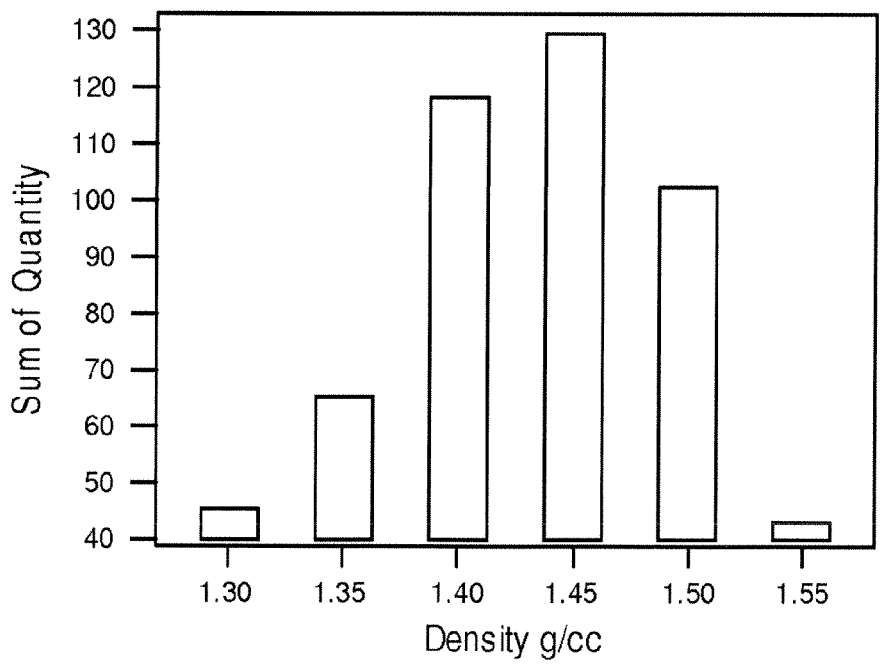

See FIGS. 7 and 9 a. Approximately 1100+/−100 substrates in a standard CVI load.
b. Total load is approximately 50% I-1 parts and approximately 50% 1-2 parts.
c. Cycle time could be reduced by about 12% compared with usual conventional cycles.
d. Use tray 1 (on the bottom), 2, and 7 (on the top) for 1-2 parts (see FIG. 7) and tray 3, 4, 5, and 6 for I-1 parts (see FIG. 9).
e. In particular, utilize the lower temperature top and bottom zones for I-2 parts (i.e., trays 1 and 7).
f. Minimize the large density gradient in the full I-1 loading configuration. I-1 parts are obtained having a bulk density from 1.35 g/cc to 1.55 g/cc.

EXAMPLE 2

Figure 11:
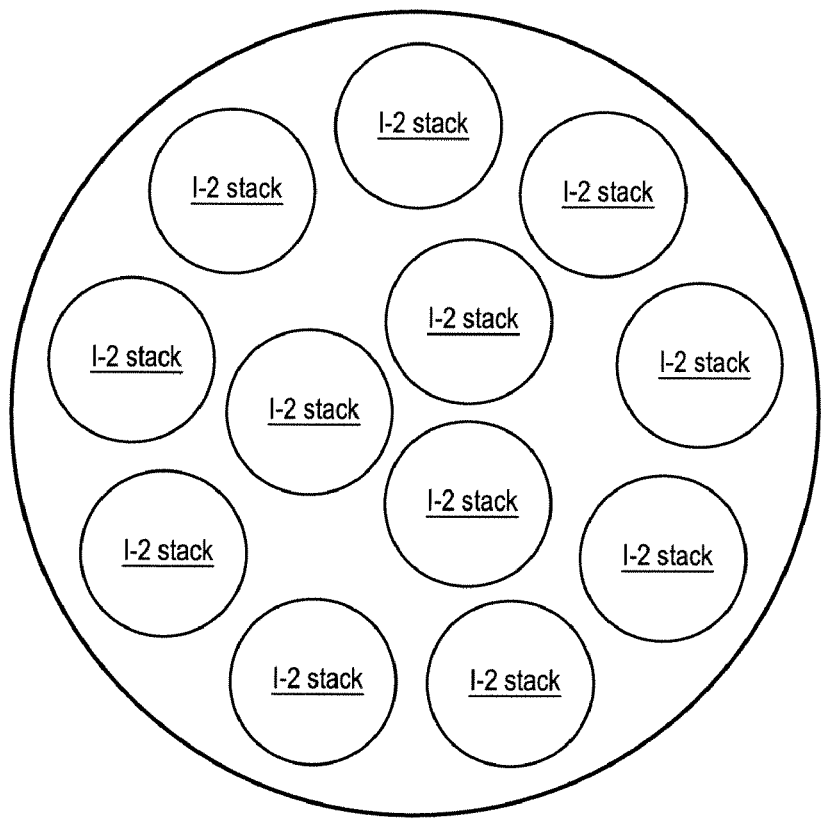
FIGS. 11 and 13 are schematic stack arrangements according to the present invention, which are used in combination according to an embodiment of the invention.
Figure 12:
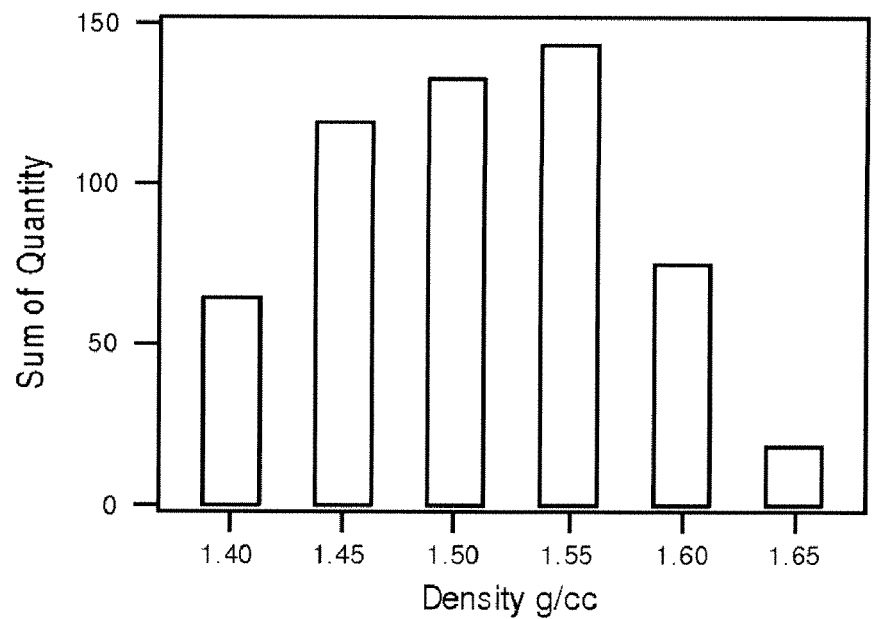
FIGS. 12 and 14 are density histograms corresponding to FIGS. 11 and 13, with respect to I-1 parts and I-2 parts, respectively.
Figure 13:
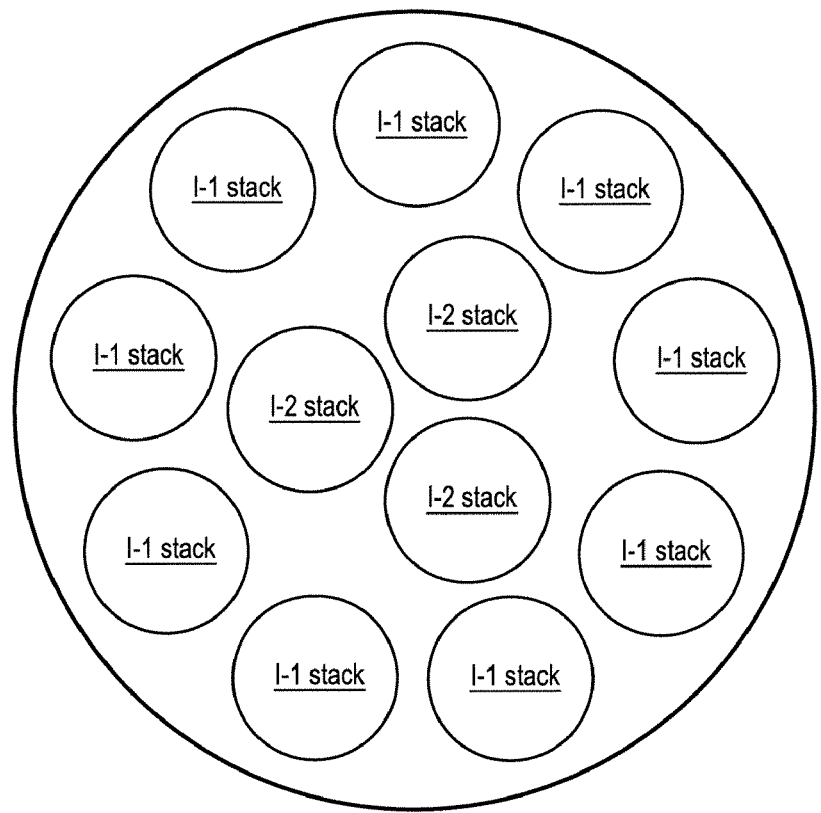
Figure 14:
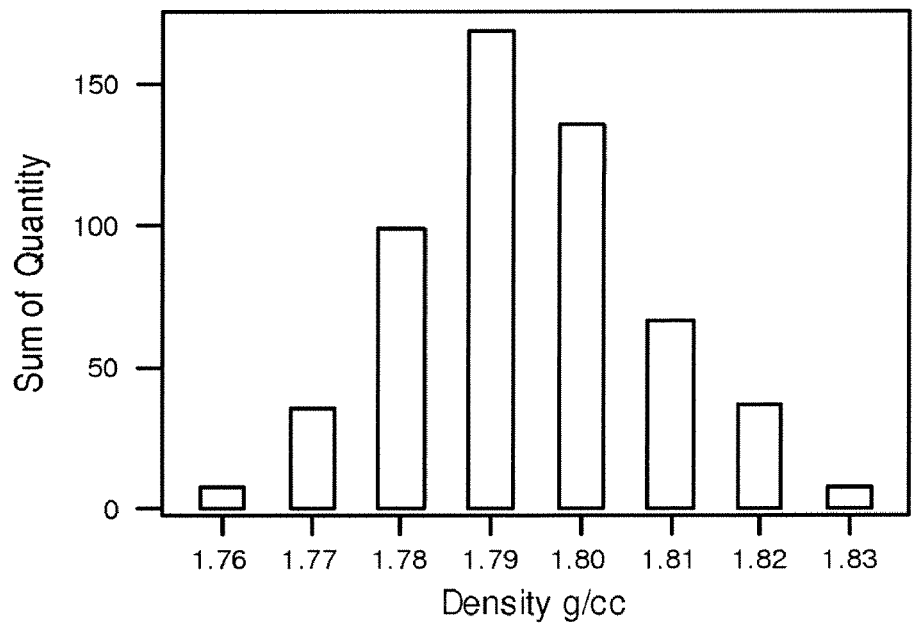

See FIGS. 11 and 13 a. Approximately 1100 (±100) substrates in a standard CVI load.
b. Load consists of 50% I-1 parts and 50% 1-2 parts.
c. Cycle time could be reduced by about 24%.
d. Uses lateral stacks in trays 2-6 for the I-1 parts (see FIG. 9) and the rest for the 1-2 parts (see FIG. 11). See FIGS. 12 and 14.

e. Provides better temperature distribution in the horizontal plane, especially for the I-1 preforms loaded in trays 2-6 at the periphery. The center I-2 stacks are used as the passive heat element in this configuration.

EXAMPLE 3

Figure 15:
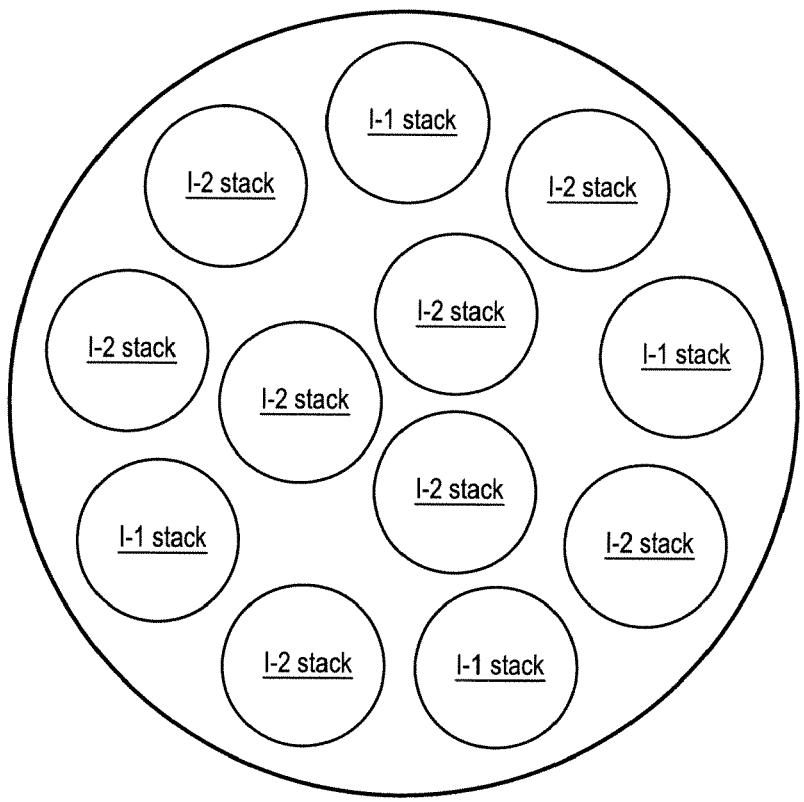
FIGS. 15 and 17 are schematic stack arrangements according to the present invention, which are used in combination according to an embodiment of the invention.
Figure 16:
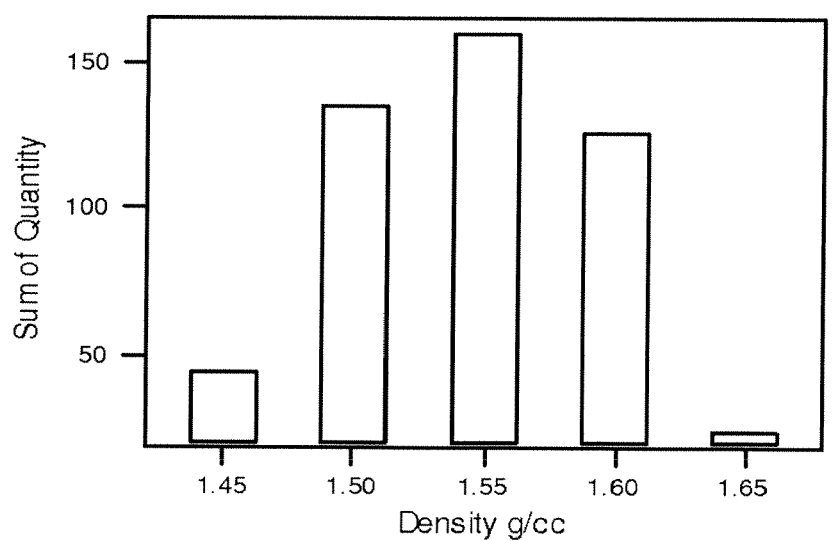
FIGS. 16 and 18 are density histograms corresponding to FIGS. 15 and 17, with respect to I-1 parts and I-2 parts, respectively.
Figure 17:
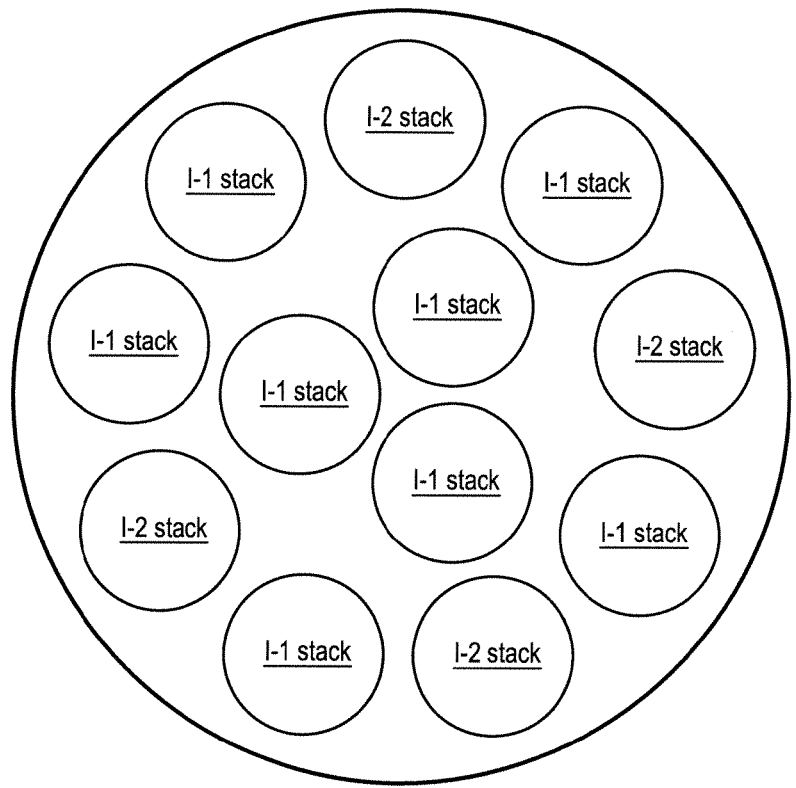
Figure 18:
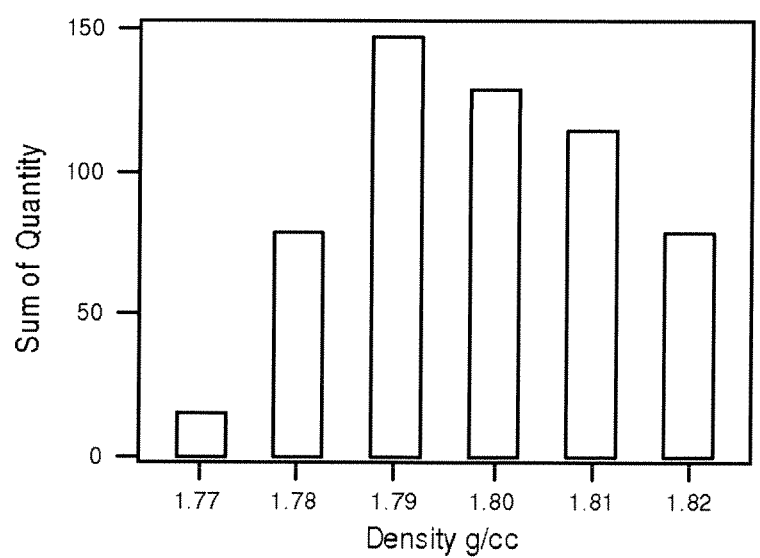

See FIGS. 15 and 17 a. Approximately 1100 (±100) substrates in a standard CVI load.
b. Load consists of 50% of the I-1 parts and 50% of the I-2 parts.
c. Each stack on each tray comprises either all I-1 parts or all I-2 parts. Stacks of I-1 parts and stacks of I-2 parts are arranged in alternating fashion about a periphery of the tray, while the center (for example, three) stacks are either all I-1 parts (see FIG. 17) or all I-2 parts (see FIG. 15). The trays are also alternatingly stacked. For example, an arrangement according to FIG. 15 may be used as trays 1, 3, 5, and 7, while an arrangement according to FIG. 17 may be used as trays 2, 4, and 6.
d. Cycle time reduction of 28% is possible.
e. Provides improved temperature uniformity both in the horizontal and vertical direction, resulting in a greater number of parts attaining a desirable density. I-2 stacks are used as the passive heat element in this configuration. (See FIGS. 16 (relative to I-1 parts) and 18 (relative to I-2 parts).)

EXAMPLE 4

Figure 19:
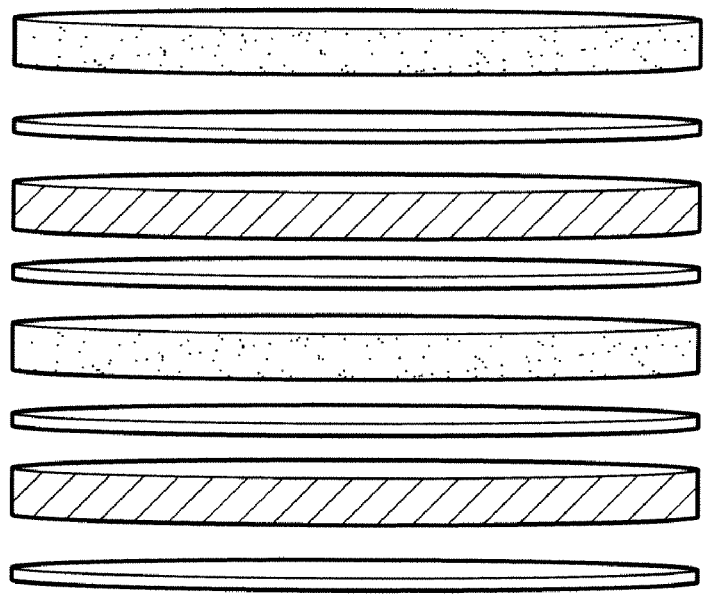
FIG. 19 illustrates an embodiment of the invention in which partially densified porous substrates are alternatingly stacked with undensified porous substrates.
Figure 20:
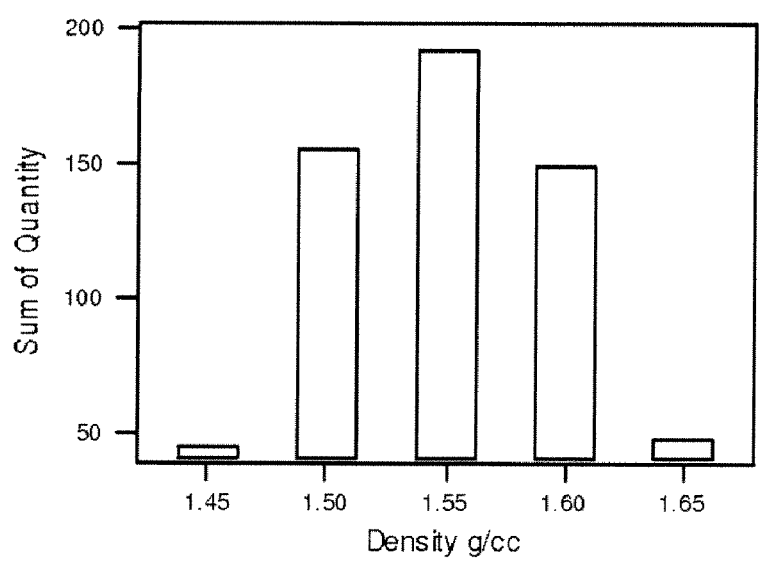
FIGS. 20 and 21 are density histograms corresponding to the stack arrangement illustrated in FIG. 19, with respect to I-1 (undensified) parts and I-2 (partially densified) parts.
Figure 21:
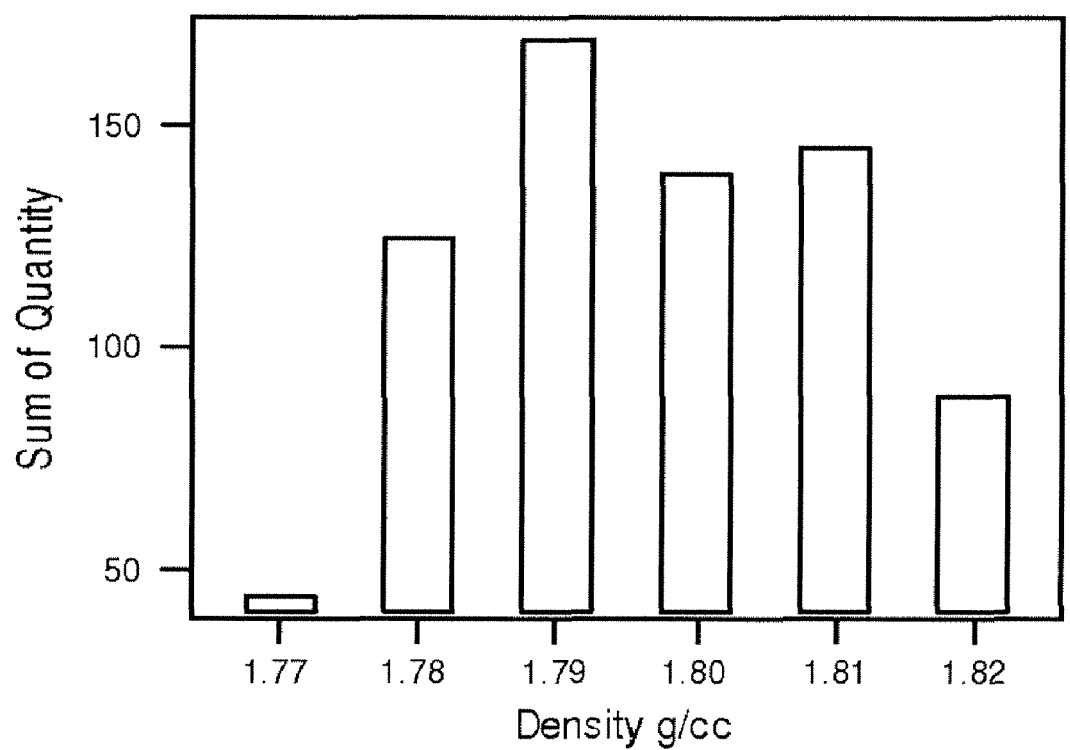

See FIG. 19 a. Approximately 1100 (±100) substrates in a standard CVI load.
b. Load consists of, in total, 35% I-1 parts and 65% I-2 parts.
c. Trays 1 and 7 have stacked I-2 parts only. Trays 2, 3, 4, 5 and 6 have a mixture of I-1 and I-2 parts, as generally illustrated in FIG. 19. In particular, I-1 parts 100 and I-2 parts 102 are piled on top of each other in the same stack. Preferably, the I-1 and I-2 parts are held slightly spaced away from each other, using blocks, spacers, or shims. A non-limitative example of a shim 104 is disclosed in U.S. Pat. No. 7,060,134.
d. Cycle time reduction of 30% is possible.
e. Improves horizontal (i.e., transverse) temperature uniformity. The I-2 parts serve as passive heat elements in this configuration.
f. Density gradient is greatly controlled in a CVI load. See FIGS. 20 and 21.

ILLUSTRATIVE EXAMPLES

TABLE 1

Experiment#1: Loading with all I-1 preforms in Tray 1
Bottom Zone Control: 1050° C. +/− 10° C.
No Gas Preheat

| Tray 1 lateral | Lateral temp ° C. | Density g/cc | Tray 1 central | Central temp ° C. | Density g/cc |
|---|---|---|---|---|---|
| preform 13 | 964 | 1.350 | preform 13 | 914 | 1.250 |
| preform 12 | n/a | 1.345 | preform 12 | n/a | 1.240 |
| preform 11 | n/a | 1.340 | preform 11 | n/a | 1.236 |
| preform 10 | n/a | 1.335 | preform 10 | n/a | 1.232 |
| preform 9 | 955 | 1.330 | preform 9 | 905 | 1.228 |
| preform 8 | n/a | 1.335 | preform 8 | n/a | 1.224 |
| preform 7 | n/a | 1.332 | preform 7 | n/a | 1.220 |
| preform 6 | n/a | 1.328 | preform 6 | n/a | 1.215 |
| preform 5 | 948 | 1.325 | preform 5 | 898 | 1.213 |
| preform 4 | n/a | 1.318 | preform 4 | n/a | 1.211 |
| preform 3 | n/a | 1.314 | preform 3 | n/a | 1.208 |
| preform 2 | n/a | 1.309 | preform 2 | n/a | 1.214 |
| preform 1 | 940 | 1.305 | preform 1 | 890 | 1.210 |

TABLE 2

Example#2: Loading with all I-1 preforms in Tray 1
Bottom Zone Control: 1050° C. +/− 10° C.
Gas Preheat Temperature: 550° C. to 750° C.

| Tray 1 lateral | Lateral temp ° C. | Density g/cc | Tray 1 central | Central temp ° C. | Density g/cc |
|---|---|---|---|---|---|
| preform 13 | 976 | 1.388 | preform 13 | 942 | 1.314 |
| preform 12 | n/a | 1.385 | preform 12 | n/a | 1.314 |
| preform 11 | n/a | 1.383 | preform 11 | n/a | 1.312 |
| preform 10 | n/a | 1.382 | preform 10 | n/a | 1.308 |
| preform 9 | 969 | 1.378 | preform 9 | 934 | 1.305 |
| preform 8 | n/a | 1.375 | preform 8 | n/a | 1.299 |
| preform 7 | n/a | 1.372 | preform 7 | n/a | 1.295 |
| preform 6 | n/a | 1.369 | preform 6 | n/a | 1.292 |
| preform 5 | 960 | 1.365 | preform 5 | 926 | 1.288 |
| preform 4 | n/a | 1.362 | preform 4 | n/a | 1.285 |
| preform 3 | n/a | 1.357 | preform 3 | n/a | 1.283 |
| preform 2 | n/a | 1.348 | preform 2 | n/a | 1.279 |
| preform 1 | 955 | 1.342 | preform 1 | 920 | 1.275 |

TABLE 3

Example#3: Loading with I-1 preforms in lateral Tray 1 + I-2 blanks in central Tray 1
Bottom Zone Control: 1050° C. +/− 10° C.
Gas Preheat Temperature: 550° C. to 750° C.

| Tray 1 lateral | Lateral temp ° C. | Density g/cc | Tray 1 central | Central temp ° C. | Density g/cc |
|---|---|---|---|---|---|
| preform 1 | 986 | 1.436 | preform 1 | 968 | 1.784 |
| preform 2 | n/a | 1.430 | preform 2 | n/a | 1.784 |
| preform 3 | n/a | 1.425 | preform 3 | n/a | 1.782 |
| preform 4 | n/a | 1.418 | preform 4 | n/a | 1.783 |
| preform 5 | 982 | 1.406 | preform 5 | 956 | 1.782 |
| preform 6 | n/a | 1.398 | preform 6 | n/a | 1.779 |
| preform 7 | n/a | 1.392 | preform 7 | n/a | 1.779 |
| preform 8 | n/a | 1.382 | preform 8 | n/a | 1.778 |
| preform 9 | 973 | 1.378 | preform 9 | 948 | 1.775 |
| preform 10 | n/a | 1.369 | preform 10 | n/a | 1.774 |
| preform 11 | n/a | 1.365 | preform 11 | n/a | 1.773 |
| preform 12 | n/a | 1.364 | preform 12 | n/a | 1.772 |
| preform 13 | 965 | 1.362 | preform 13 | 940 | 1.771 |

TABLE 4

Example#4: Loading with I-2 blanks in Tray 1
Bottom Zone Control: 1050° C. +/− 10° C.
Gas Preheat Temperature: 550° C. to 750° C.

| Tray 1 lateral | Lateral temp ° C. | Density g/cc | Tray 1 central | Central temp ° C. | Density g/cc |
|---|---|---|---|---|---|
| I-2 blank 1 | 990 | 1.805 | I-2 blank 1 | 978 | 1.785 |
| I-2 blank 2 | n/a | 1.801 | I-2 blank 2 | n/a | 1.784 |
| I-2 blank 3 | n/a | 1.797 | I-2 blank 3 | n/a | 1.783 |
| I-2 blank 4 | n/a | 1.797 | I-2 blank 4 | n/a | 1.783 |
| I-2 blank 5 | 987 | 1.796 | I-2 blank 5 | 959 | 1.782 |
| I-2 blank 6 | n/a | 1.795 | I-2 blank 6 | n/a | 1.780 |
| I-2 blank 7 | n/a | 1.795 | I-2 blank 7 | n/a | 1.779 |
| I-2 blank 8 | n/a | 1.793 | I-2 blank 8 | n/a | 1.778 |
| I-2 blank 9 | 981 | 1.791 | I-2 blank 9 | 952 | 1.775 |
| I-2 blank 10 | n/a | 1.789 | I-2 blank 10 | n/a | 1.774 |
| I-2 blank 11 | n/a | 1.788 | I-2 blank 11 | n/a | 1.773 |
| I-2 blank 12 | n/a | 1.785 | I-2 blank 12 | n/a | 1.773 |
| I-2 blank 13 | 975 | 1.785 | I-2 blank 13 | 945 | 1.771 |

The present invention results in several desirable effects.

In the prior art, a greater densification gradient is observed from the furnace load mainly due to the larger thermal gradient observed in both longitudinal and lateral direction. In the present invention, several new loading configurations are disclosed to minimize thermal gradient within the conventional CVI furnace.

A more controllable uniform temperature condition can be maintained throughout the furnace without sacrificing internal space for processing substrates. In contrast, conventional solutions, such as increasing the size of a conventional gas preheater) take up space that could be used to produce more substrates.

The present invention establishes an essentially isothermal condition within and across a porous preform.

Cycle time reductions between 12% and 30% compared to conventional processes may be possible without loss of production capacity.

A suitable apparatus for densifying annular performs to make brake disks and the like is disclosed in, for example, U.S. Pat. No. 6,572,371.

Figure 22:
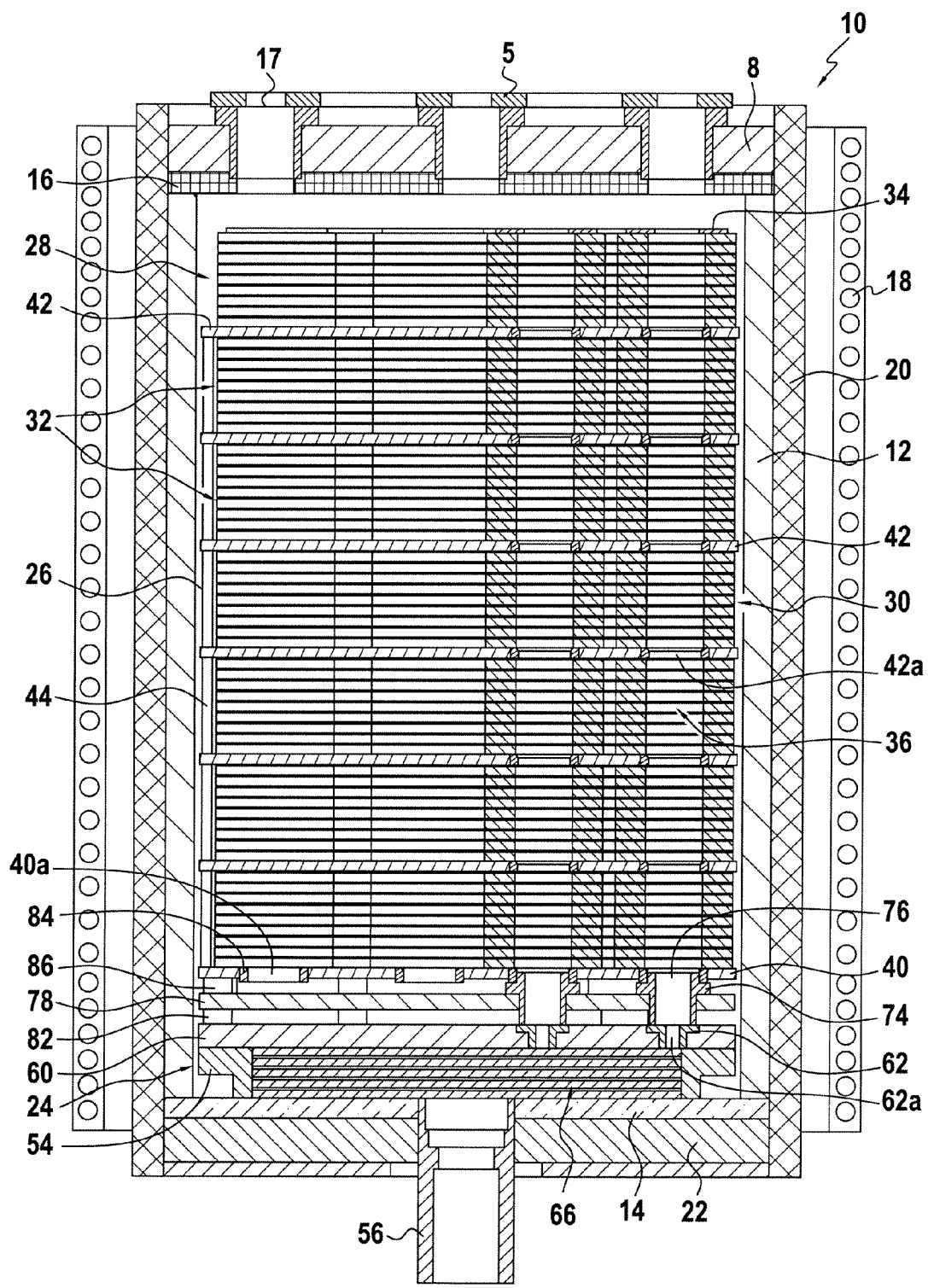
FIG. 22 is a cross-sectional elevational view of a CVI furnace usable with the present invention.

FIG. 22 is a highly diagrammatic illustration of a fully loaded CVD/CVI furnace 10. As shown, the hardware assembly includes a graphite susceptor 12, a susceptor bottom 14, and a susceptor top 16 which defines the furnace internal volume 26. The internal volume 26 therein containing a load of annular substrates or pre-densified blanks 30 made from carbon fiber. The load is in the form of a stack of substrates 32 having their respective central passages generally in vertical alignment so as to define an interior space. The stack 32 may be made up of a plurality of superposed stack sections separated by one or more intermediate loading trays 42. Multiple loading trays are arranged above the gas preheating zone 24 and the susceptor bottom 14.

FIG. 22 also illustrates the hardware assembly inside of a CVD/CVI furnace 10. Furnace insulation 20 is interposed between the induction coil 18 and graphite susceptor 12. In addition, top furnace insulation 8 and bottom insulation 22 are placed outside of the graphite susceptor enclosure. The internal volume of the furnace 10 is heated by means of susceptor 12, e.g. made of graphite, which serves to define the enclosure 26. The induction coil 18 is to provide multiple zones heating to the graphite susceptor 12. As a variant, heating of the susceptor 12 can be resistively heated. Other methods of heating may be used such as resistive heating using the Joule effect.

The internal volume of the furnace 26 is defined by a gas preheating zone 24 located at the bottom of the furnace and a reaction chamber inside of graphite susceptor 12 where annular substrates are placed. The annular substrates 30 are arranged so as to form a plurality of annular vertical stacks resting on a bottom loading tray 40. Each stack of substrates may be subdivided into a plurality of superposed sections that are separated by one or more intermediate trays 42. The trays 40 and 42 may be made of graphite or Carbon/Carbon composites. They have passages 40a and 42a formed therethrough in alignment with the internal passages of the substrates. The intermediate trays are supported by way of pillars 44. Pillars 44 could be made from, for example, graphite.

FIG. 22 illustrates an example of twelve stacks of substrates positioned on a loading tray 42, with nine lateral stacks regularly spaced about a periphery of the tray, and three stacks located centrally. Other arrangements may be provided. For instance, eight stacks may be provided, with seven stacks at a periphery of the tray and one stack located at a central position.

Each annular stack 32 is closed at the top by a graphite cover 34 as shown in FIG. 22, whereby the internal volume of the reaction chamber 26 is subdivided into a plurality of stack internal volume 36 and a volume 28 outside of the stacks. Each stack internal volume is formed by the aligned central passages of the substrates 30 and intermediate trays 42.

FIG. 27 shows 12 stacks of substrates separated from one another by means of spacers 38 or a one-piece shim disclosed in U.S. patent application No. 2004/0175564. The spacers provide gaps of substantially constant height throughout the entire stack between adjacent substrates, while allowing the inside volume 36 of the stack, as constituted by the generally aligned central passages of the substrates, to communicate with the outer volume 28.

Each substrate 30 in a stack 32 is spaced apart from an adjacent substrate, or, where appropriate, from a loading tray 40, 42 or cover 34 by spacers 38 which leave gaps 39 between substrates. The spacers 38 may be arranged to leave passages for the precursor gases to pass between volumes 36 and 28. These passages can be provided in such a manner as to ensure pressures in volumes 36 and 28 are in equilibrium, as described in U.S. Pat. No. 5,904,957, or so as to create and maintain a pressure gradient between the volume 36 and 28.

Figure 23:
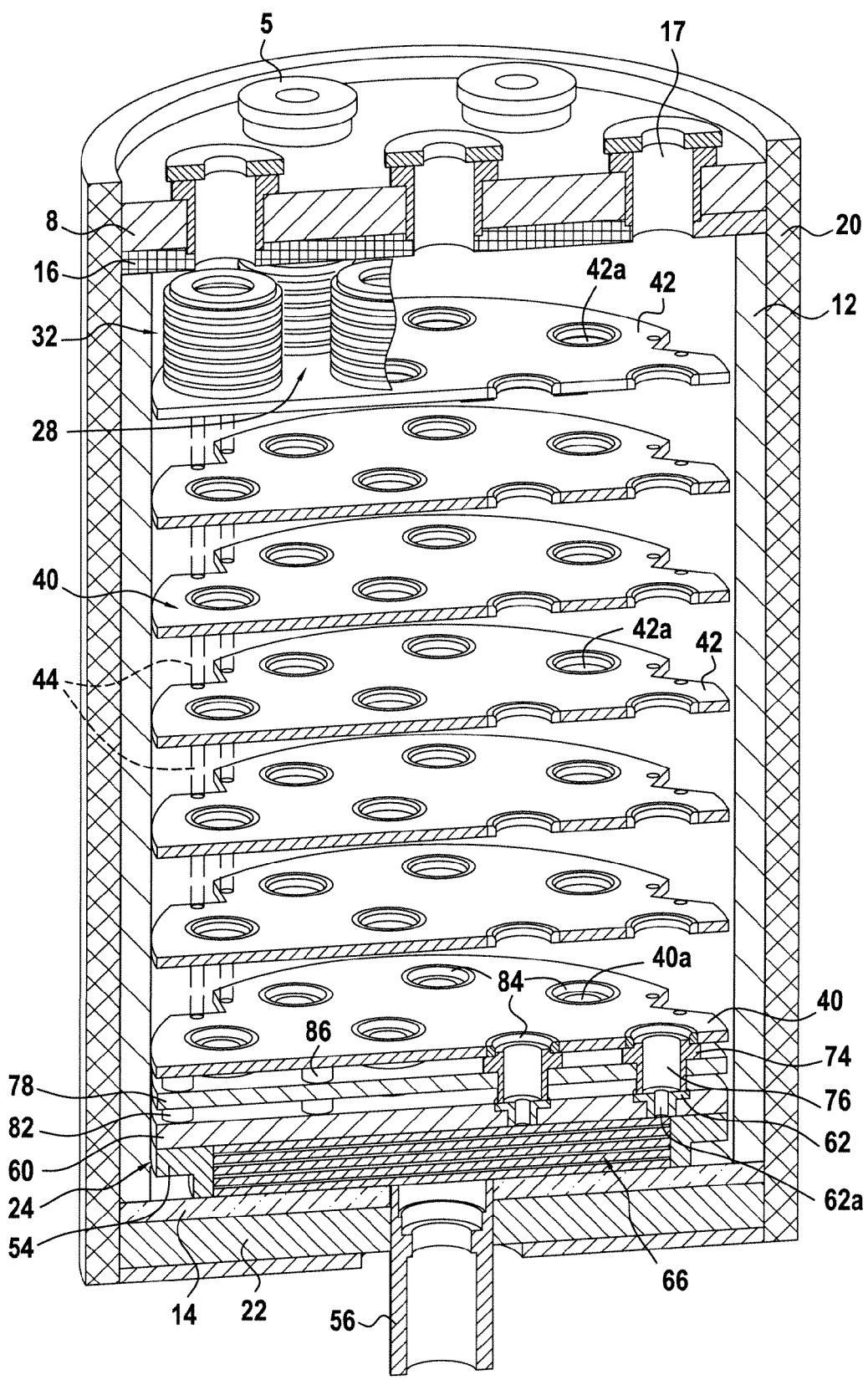
FIG. 23 is a cross-sectional perspective view corresponding generally with FIG. 22.
Figure 24:
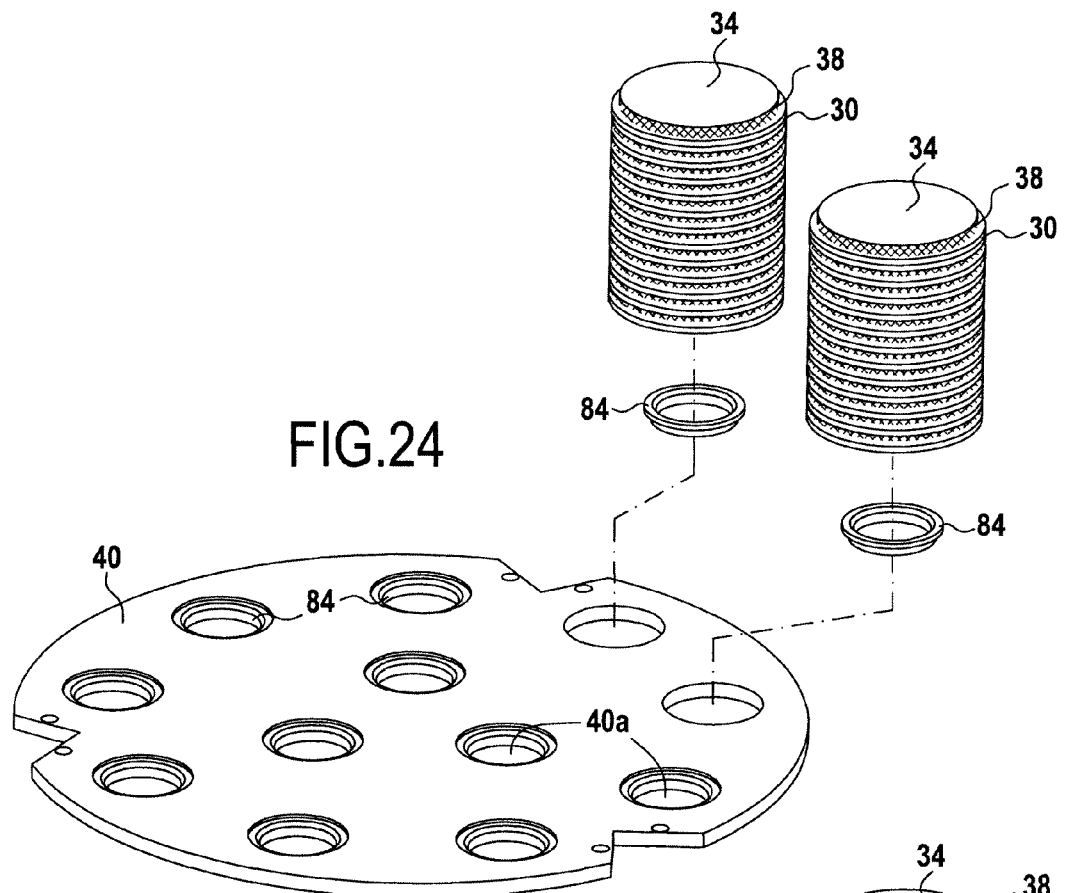
Figure 25:
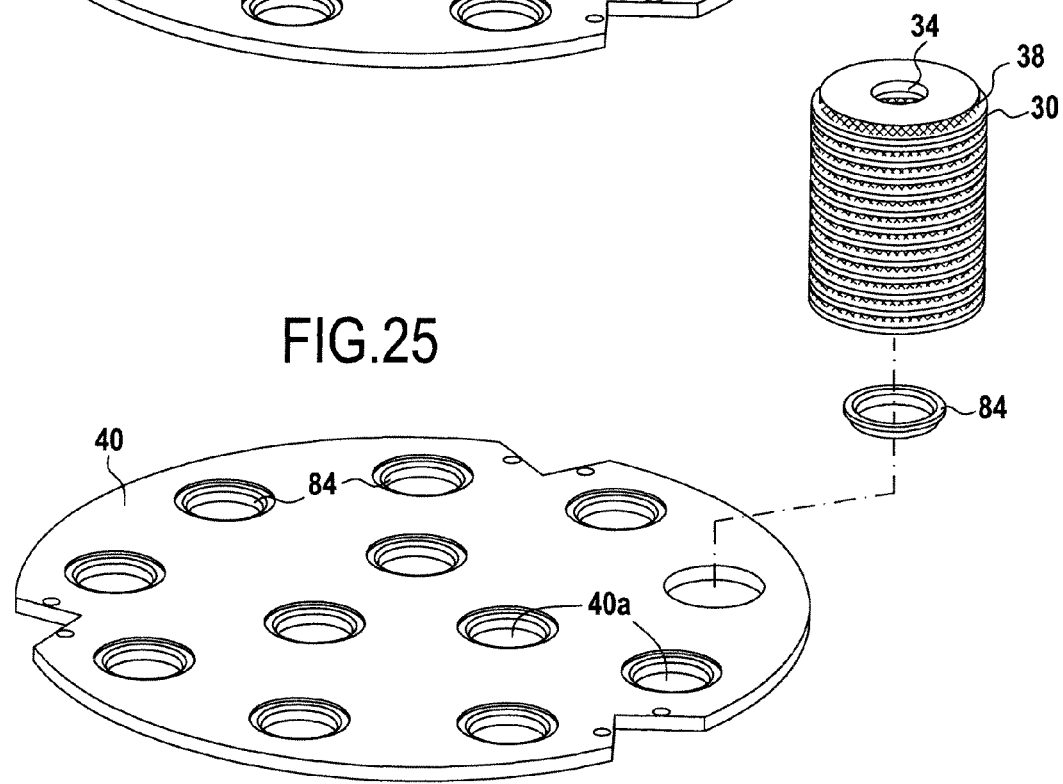
Figure 28:
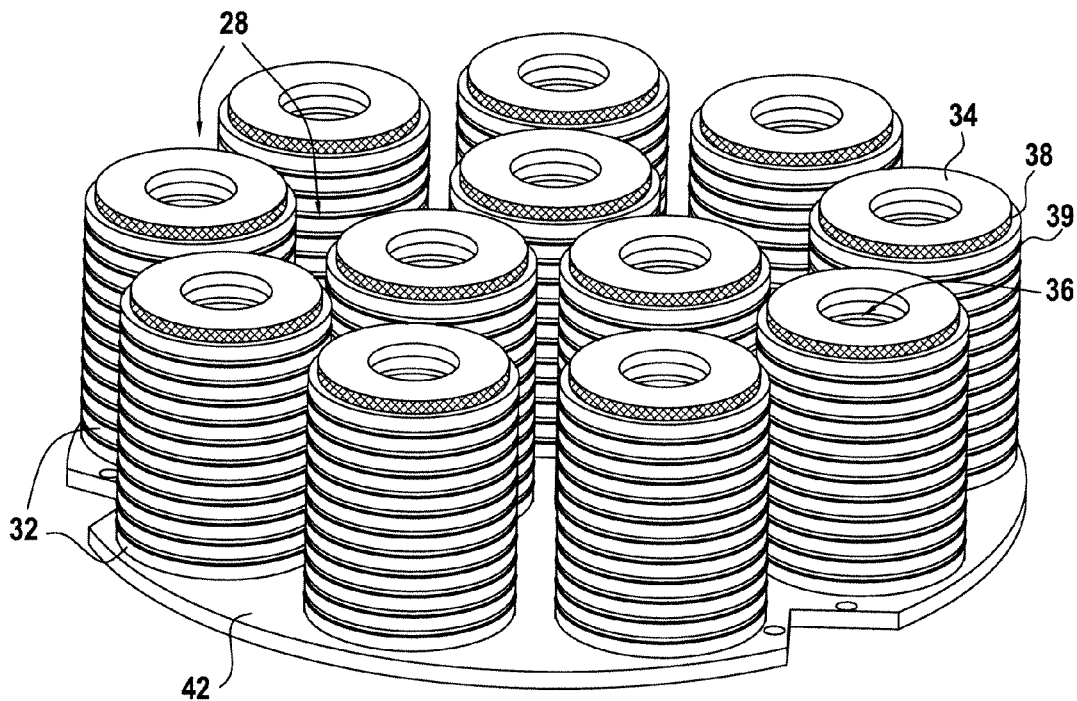
Figure 29:
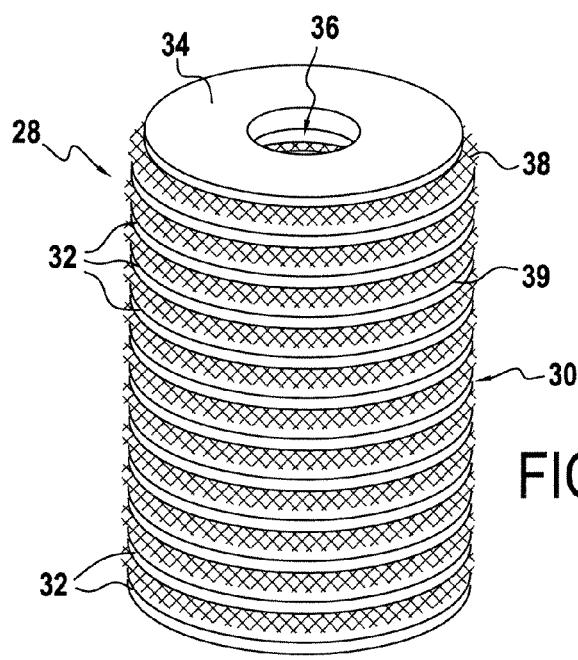

The internal gas preheat zone 24 (see FIGS. 22 and 23) which is used to preheat the precursor gases, may be as described in U.S. Pat. No. 6,572,371, for example, and is made of a preheating chamber 54, a gas distribution plate 60, and perforated plates 66 as shown in FIG. 23.

Precursor gases are admitted through inlet 56 before reaching passage 62a. Preheating is performed by sending precursor gases through a plurality spaced apart of perforated plates 66. Accordingly, the preheat hardware assembly is easy to load and unload for inspection and maintenance.

The gas preheating chamber 54 is covered by a gas distribution plate 60. The gas distribution plate has passages 62a formed therethrough in registration with passage 40a and internal volumes of 36 of the stacks 32.

Gas admitted though inlet 56 is preheated within the preheating chamber 54 before reaching passages 62a. Preheating is performed by forcing the precursor gases to flow along through a plurality spaced apart of perforated plates 66 extending horizontally between the susceptor bottom wall 14 and the gas distribution plate 60.

Gas exiting through passages 62a of the gas distribution plate 60 is channeled through chimney 74 which are inserted into passages 76. Plate 78 is supported by gas distribution plate 60 by means of pillars 82.

The chimney 74 communicates with the passage 40a of the bottom loading tray 40. Graphite rings 84 are inserted in passages 40a and rest upon the upper edge of chimneys 74 for channelling the flow of gas between plates 78 and 40. Plate 40 is supported by plate 78 by means of post 86.

After desired temperature within the furnace load has been reached, precursor gases are admitted through gas inlet 56.

The precursor gases are preheated by channelling through the perforated plates 66 in the preheating chamber 54.

The preheated gas leave the preheating chamber 54 through nozzles 62 and is further heated by heat exchanger with the walls of chimneys 74 and inserts 84, before reaching the internal volumes of the stacks of substrates.

The gas admitted into the internal volume 36 of a stack of substrates reaches volume 28 of the reaction chamber by diffusing through the porosity of the substrates and forming desired matrix constituting deposits and eventually passing through gaps 39. The effluent gas is extracted from the volume 28 of the reaction chamber through an exhaust outlet 17 formed in the susceptor top wall 16 and connected to a pumping device (not shown). Top thermal shields 5 are positioned on top of the exhaust outlet 17 for the purpose of blocking of the radiation during furnace operation.

In general, it is also known to process porous substrates that have, by some means, a thickness less than that generally processed, such that one or more such porous substrates (each having a reduced thickness) are assembled (for example, by needling or mechanical fixtures) to obtain a resultant product having the required thickness. For example, when used brake disks are refurbished, they may sometimes be machined before they are redensified, thereby creating a reduced thickness part to be redensified. In other cases, a preform may be formed from the outset using a smaller number of fabric layers, which are needled in the conventional sense.

The advantage of using reduced thickness substrates in this manner is that they can generally be densified faster than "full" thickness articles, even to the extent that they could be densified in a single densification cycle instead of multiple cycles.

Although the present invention has been described above with reference to certain particular examples for the purpose of illustrating and explaining the invention, it is to be understood that the invention is not limited solely by reference to the specific details of those examples. More specifically, a person skilled in the art will readily appreciate that modifications and developments can be made in the preferred embodiments without departing from the scope of the invention as defined in the accompanying claims.

What is claimed is:

1. A method of densifying porous substrates using chemical vapour infiltration ("CVI") in a CVI furnace, wherein the CVI furnace comprises a precursor gas preheating zone and a reaction chamber in which the porous substrates are densified, the CVI furnace comprising a bottom wall separating the precursor gas preheating zone and the reaction chamber, the bottom wall having a plurality of openings formed therethrough corresponding to a plurality of locations at which stacks of the porous substrates are positioned, the method of densifying comprising:

arranging at least a first plurality of stacks of porous substrates in the reaction chamber, wherein stacks of porous substrates located at a periphery of the reaction chamber are undensified porous substrates, partially densified porous substrates, or a combination of undensified and partially densified porous substrates, and one or more stacks of partially densified substrates are located at a central location among the first plurality of stacks of porous substrates so that the porous substrates that are arranged at the periphery and at the central location of the reaction chamber have different densified states, and densifying the at least first plurality of stacks of porous substrates using a chemical vapour infiltration process.

2. The method of claim 1, wherein the undensified porous substrates have a bulk density range of 0.35 g/cc to 0.60 g/cc.

3. The method of claim 2, wherein
the partially densified porous substrates have a bulk density range of 1.25 g/cc to 1.77 g/cc;
the one or more stacks of partially densified substrates located at the central location among the first plurality of stacks of porous substrates has a total mass of about 1600 kg to about 8000 kg;
a step is provided of spacing apart adjacent porous substrates in a given stack using a spacer or a shim;
a step is provided of spacing apart adjacent porous substrates in a given stack using a unitary shim made from a woven wire mesh material;
the unitary shim has an effective thickness of about 1 mm to about 6 mm;
a step is provided of arranging a plurality of stacks of porous substrates on a respective one of a plurality of loading trays, and disposing the plurality of loading trays having a plurality of porous substrates arranged thereon in the reaction chamber.

4. The method of claim 3 wherein the partially densified porous substrates have been previously machined to reduce their thickness.

5. The method of claim 1, wherein the partially densified porous substrates have a bulk density range of 1.25 g/cc to 1.77 g/cc.

6. The method of claim 1, wherein the one or more stacks of partially densified substrates located at the central location among the first plurality of stacks of porous substrates has a total mass of about 1600 kg to about 8000 kg.

7. The method of claim 1, comprising spacing apart adjacent porous substrates in a given stack using a spacer or a shim.

8. The method of claim 7, comprising spacing apart adjacent porous substrates in a given stack using a unitary shim made from a woven wire mesh material.

9. The method of claim 8, wherein the unitary shim has an effective thickness of about 1 mm to about 6 mm.

10. The method of claim 1, comprising arranging a plurality of stacks of porous substrates on a respective one of a plurality of loading trays, and disposing the plurality of loading trays having a plurality of porous substrates arranged thereon in the reaction chamber.

11. The method of claim 1, wherein at least some of the stacks of porous substrates comprise alternating stacked undensified and partially densified substrates.

12. The method of claim 1 wherein the partially densified porous substrates have been previously machined to reduce their thickness.

13. The method of claim 1, wherein the substrates that are arranged at the center of the reaction chamber are more densified than the substrates that are arranged at the periphery of the reaction chamber.

14. The method of claim 1, wherein the partially densified substrates are arranged in the reaction chamber so that, during densification of the porous substrates, said partially densified substrates enable reduction of a temperature gradient in the reaction chamber.

15. The method of claim 14, wherein, during densification, said partially densified substrates radiate heat to surrounding porous substrates to reduce the temperature gradient in the reaction chamber.

* * * * *